Jan. 27, 1970 J. DI GIROLAMO ET AL 3,492,536

MEANS FOR ANCHORING AND CONNECTING LEAD WIRES TO AN ELECTRICAL COMPONENT

Filed Jan. 18, 1968

INVENTOR
JOSEPH DI GIROLAMO
STANLEY O. BENDER
BY John J. Gaydos
ATTORNEY

United States Patent Office 3,492,536

Patented Jan. 27, 1970

3,492,536

MEANS FOR ANCHORING AND CONNECTING LEAD WIRES TO AN ELECTRICAL COMPONENT

Joseph Di Girolamo and Stanley O. Bender, Berne, Ind., assignors to CTS Corporation, Elkhart, Ind., a corporation of Indiana Filed Jan. 18, 1968, Ser. No. 698,824
Int. Cl. H02b *1/04, 9/00*
U.S. Cl. 317—101 9 Claims

ABSTRACT OF THE DISCLOSURE

An electrical component having a ceramic dielectric substrate provided with notches having a constricted section and an enlarged section. Lead wires are firmly anchored in the notches by having a portion of each of the lead wires deformed, preferably during insertion, to correspond to the constricted and the enlarged sections of the notch. Conductive pads and metal bodies electrically connect the lead wires to an electrical device, e.g., a resistance element, supported on the substrate.

Figures 1, 2, 3:
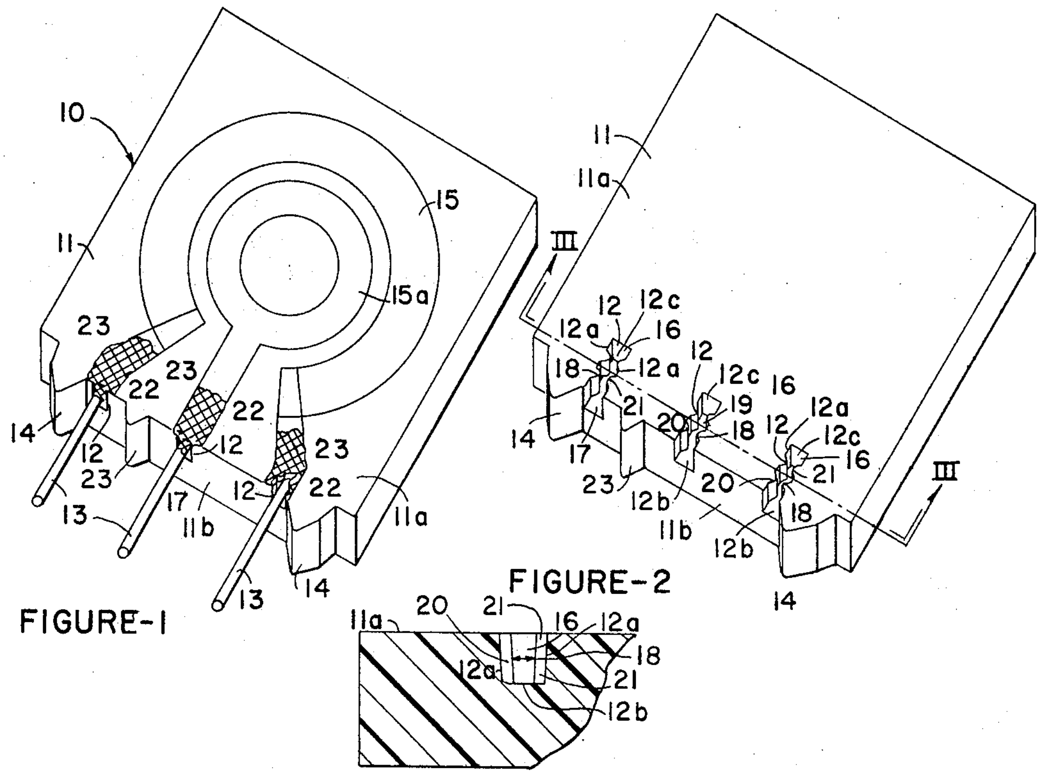

The present invention relates to electrical components and, more particularly, to improved means for anchoring and connecting lead wires to an electrical device, e.g., an active device such as a transistor or a passive device such as a resistance element or a capacitor, supported on the surface of a substrate forming part of the electrical component.

In order that the terminology used in the specification will be fully understood, certain terms will now be defined as follows:

Electrical device—includes both active and passive devices.

Active device—denotes an electrical circuit element, e.g., a diode or a transistor, capable of performing amplifying or control functions.

Passive device—denotes an electrical circuit element not capable of performing amplifying or control functions, e.g., a resistor or a capacitor.

For certain electronic equipment, the anchoring of lead wires to a substrate of an electrical component must be sufficiently strong to prevent the lead wires from being loosened or removed from the substrate as the electrical component is inserted into and removed from a terminal board. Brady et al. Patent No. 3,280,378, assigned to the same assignee as the present invention, shows an electrical component having lead wires directly anchored in cavities provided in the substrate by forcing the lead wires axially into the cavities. Although the anchoring of lead wires in electrical components disclosed in the Brady et al. patent is satisfactory for certain electronic equipment, other electronic equipment requires that the axial pull-out strength of the lead wires be substantially greater than the axial pull-out strength attainable by using the Brady et al. invention. The present invention, therefore, increases the pull-out force required to remove the lead wire axially from the substrate and is an improvement in the anchoring means shown in the Brady et al. patent.

When the opening of a notch communicates only with the front surface of the substrate, it is necessary to deposit a conductive pad on the front surface around the opening and a conductive path around the edge of the substrate before the conductive pad can be connected to an electrical device deposited on the top surface of the substrate. Frequently a break or opening occurs in the conductive path at the edge of the substrate unless care is exercised in depositing the conductive material. By providing the cavities or notches with front and top openings, it is not necessary to extend the conductive path around the edge of the substrate. The top opening in the notch also facilitates insertion and deformation of the lead wire to improve the anchoring means. It would, therefore, be desirable to improve the anchoring of lead wires to a ceramic dielectric substrate and to improve the connecting means between the lead wires and the electrical device carried on a surface of the substrate.

Accordingly, it is an object of the present invention to provide a new and improved means for anchoring and connecting lead wires in an electrical component. Another object of the present invention is to provide an electrical component with a substrate having a plurality of notches, each notch containing a constricted section and an enlarged section for anchoring a portion of a lead wire therein. An additional object of the present invention is to provide an electrical component with a substrate having a plurality of notches, each notch containing a constricted and an enlarged section, and lead wires are anchored in the notches having deformed end portions corresponding to the sections of the notches. A further object of the present invention is to provide an electrical component with a substrate having a plurality of nothes with lead wires anchored therein, and wherein the notches are provided with top openings communicating with the top surface of the substrate to facilitate an electrical connection between the lead wires and an electrical device supported on the top surface of the substrate.

Briefly, the invention is concerned with an improved electrical component of the modular type, i.e., a circuit module, comprising a substrate of ceramic dielectric material having an electrical device supported on at least one surface thereof. The substrate is provided with a plurality of notches, each notch having a top opening communicating with the one surface, e.g., the top surface, and a front opening communicating with the front surface of the substrate. Each of the notches is provided with a constricted section and an enlarged section inwardly of the constricted portion, and a lead wire is anchored in each of the notches. A portion of the lead wire conforming to the contour of the notch substantially increases the pull-out strength of the lead wire in an axial direction. Conductive pads are bonded to areas of the top surface of the substrate around the top openings of the notches, and metal bodies electrically connect the lead wires to the conductive pads.

Figure 4:
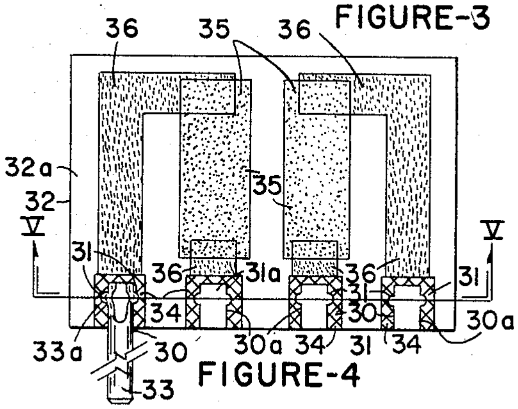
Figure 6:
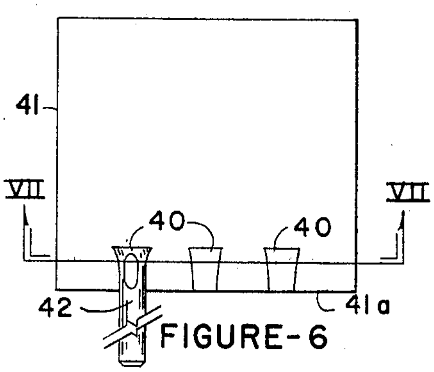
Figure 5:
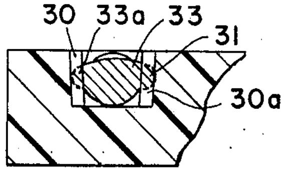
Figure 7:
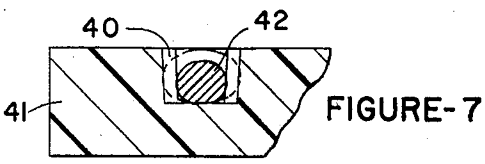

FIGURE 1 is an isometric view of an electrical component for a variable resistance control built in accord with the present invention; FIGURE 2 is an isometric view of a substrate employed for making the electrical component of FIGURE 1; FIGURE 3 is a fragmentary sectional view taken along line III—III of FIGURE 2; FIGURE 4 is a top plan view of another embodiment of the present invention; FIGURE 5 is a fragmentary sectional view taken along line V—V of FIGURE 4; FIGURE 6 is a top plan view of still another embodiment of the present invention; and FIGURE 7 is a fragmentary sectional view taken along line VII—VII of FIGURE 6.

Referring now to FIGURES 1 and 2 of the drawings, there is illustrated an electrical component 10 comprising a substrate 11 having a plurality of notches 12 provided therein and a plurality of lead wires 13 anchored in the notches. A pair of forwardly projecting stand-offs 14 preferably integral with the front surface of the substrate 11 are useful for spacing the substrate from a not-shown mounting panel. An electrical device 15 is deposited on the top surface 11*a* of the substrate and electrically connected to the lead wires 13. The substrate 11 is molded of a high temperature heat-resistant material preferably a ceramic such as alumina, steatite, porcelain, barium titanate or the like and then fired. Other substrate materials such as glass can also be used so long as the firing temperature for processing the electrical device 15, e.g., a resistance element, is lower than the softening temperature of the substrate materials.

Any suitable technique and composition may be employed for depositing the electrical device 15 on the substrate. For example, the resistance composition disclosed in Faber et al. Patent No. 3,304,199 can be screened onto the surface 11*a* of the substrate and then fired to produce a resistance element. Other passive devices such as capacitors can also be deposited on the substrate. Such devices can be produced by sputtering, photoetching, screening, and other printed circuit techniques which can be employed in a conventional and well-known manner. A transistor or capacitor chip can also be deposited on the surface 11*a* of the substrate. The resistance element 15 shown in FIGURE 1 of the drawings is arcuate to permit use of the component 10 as the base of a not-shown variable resistance control. A center collector 15*a* is deposited on the top surface 11*a* of the substrate concentric to the resistance element 15, and a not-shown rotatable contactor wipingly engaging the resistance element 15 and the center collector 15*a* is employed for altering the ohmic resistance between the center and outer terminals.

Referring now specifically to the notches 12, each notch is provided with a first or top opening 16 communicating with the top surface 11*a* of the substrate and a second or front opening 17 communicating with the front surface 11*b* of the substrate. The top surface 11*a* and the front surface are normal to each other and form an edge of the substrate. The notches can be of any desirable configuration so long as each of the notches is provided with a constricted section 18 and with an enlarged section 19, the constricted section always being closer to the front surface of the substrate than the enlarged section. Each notch is defined by a pair of side walls 12*a*, a bottom wall 12*b* and a rear wall 12*c*. The side walls 12*a* of each of the notches are provided with a pair of inwardly extending protuberances or bosses 20, 21 projecting upwardly from the bottom wall 12*b* of each of the notches. The constricted section 18 of each of the notches is defined by the distance between opposed bosses 20, 21 and the enlarged section of the notch is defined by the portion of the notch inwardly of the bosses from the front surface 11*b*. The bosses 20, 21 are tapered as best shown in FIGURE 3 to increase the width of the constricted section at the top surface 11*a*. The taper extends from the bottom wall 12*b* to the top surface 11*a*. In essence the side walls 12*a* are serrated or undulated, each of the bosses 20, 21 defining the individual serrations or undulations of the side walls. Maximum pull-out strength of the lead wires 13 in the axial direction is obtained by having the major axis of each of the bosses 20, 21 vertically disposed and lying in a plane substantially parallel to the front surface 11*b*.

Before the lead wires 13 are anchored in the notches 12, conductvie coatings are deposited around each of the top openings 16 of the notches 12 to form conductive pads 22. The conductive pads can also extend into the notches along the side and rear walls 12*a* and 12*c* to improve the electrical connection between the lead wires and the conductive pads. Depending upon the composition of the many types of conductive coatings readily available, the conductive pads can be air-dried or fired after being deposited on the surface of the substrate. After the conductive pads 22 are bonded to the substrate 11, the end portion of one of the lead wires 13 is positioned over one of the top openings 16 of a notch with the remainder of the lead wire extending forwardly of the front surface 11*b*, the axis of the end portion of the lead wire being parallel to the top surface 11*a* of the substrate supporting the electrical device 15. A suitable tool such as a punch then forces the end of the lead wire into the notch 12 wedging the lead wire in the substrate. Preferably the diameter of the lead wire is substantially the same as the distance between the opposed bosses 20, 21 at the constricted section and the end portion of the lead wire entering the enlarged section of the notch is deformed or flattened to increase the width of the lead wire in the enlarged section and anchor the lead wire in the notch. On the other hand, if the diameter of the lead wire is greater than the width of the constricted section, the portion of the lead wire entering the constricted section is deformed causing the diameter of the lead wire to be reduced to the width of the constricted section while the portion of the lead wire entering the enlarged section is flattened thereby increasing the width of the lead wire and anchoring the lead wire in the notch. Obviously excessive reduction or necking of the lead wires in the constricted sections unnecessarily decreases the pull-out strength of the lead wires.

After the lead wires are anchored in the notches, conductive materials such as solder bodies 23 are deposited in the notches for electrically connecting the ends of the lead wires to the conductive pads. By covering at least a portion of the side walls 12*a* of the notches 12 with the conductive coating prior to insertion of the lead wires 13, improved electrical connections are attained between the lead wires and the conductive pads since the conductive materials readily adhere to the coated side walls and to the lead wires. Preformed lead wires having a headed portion, a flattened end portion or a reduced neck portion can be employed and inserted into the notches with less force. Although such preformed lead wires will resist a substantial pull-out force in the axial direction, the pull-out strength normal to the axis of the lead wire is reduced somewhat unless sufficient anchoring of the lead wire occurs when the lead wires are connected to the conductive pads with solder. The pull-out strength normal to the axis of the lead wire can be increased by reversing the taper of the sidewalls 12*a* and having the bosses closer together at the top surface 11*a* instead of at the bottom wall 12*b*.

In the embodiment of FIGURES 4 and 5, lead wires 33 are inserted into notches 30 and the end portions 33*a* of the lead wires are flattened to fill the grooved or enlarged sections 31 in the sidewalls 30*a*. Suitable conductive pads 34 are deposited on the top surface 32*a* of the substrate 32 around each of the top openings 31*a* of the notches 30. A pair of resistance elements 35 are deposited on the substrate and conductive paths 36 also deposited on the substrate electrically connect the lead wire 33 to the resistance elements 35. Not-shown solder bodies are deposited in the notches around the end portions 33 for electrically connecting the lead wires 33 to the conductive pads. In still another embodiment shown in FIGURES 6 and 7 of the drawings, the notches 40 in the substrate 41 are of dovetail configuration and, accordingly, each of the front portions of the dovetail notches adjacent to the front surface 41*a* defines the constricted section of the notch while the inward or rearwardly disposed portion of the notch 40 defines the enlarged section. Lead wires 42 are anchored in the dovetail notches of the substrate in the same manner as described for the embodiments shown in FIGURES 1–5 of the drawings.

Preferably the side walls are tapered slightly toward the bottom wall for all of the notches shown in FIGURES 1–7 of the drawings to facilitate molding of the substrates, the tapers can be reversed. Although all of the notches shown in the drawings are symmetrical, i.e., one side wall of a notch is symmetrical to the other sidewall, a notch can have nonsymmetrical walls, e.g., the boss or groove need only be a part of one of the sidewalls and the other side wall can be substantially planar.

From the above description, it will be apparent that a very simple and improved means for securing the lead wires to a substrate has been provided. In view of the above discussion, the steps involved in making the notches in the substrates and securing the lead wires in the notches of the substrate will be clearly understood and no further discussion is included herewith.

While there has been illustrated and described what is at present considered to be a preferred embodiment of the present invention, and two modifications thereof, it will be appreciated that numerous changes and modifications are likely to occur to those skilled in the art, and it is intended in the appended claims to cover all those changes and modifications which fall within the true spirit and scope of the present invention.

What is claimed as new and desired to be secured by Letters Patent of the United States is:

1. In an electrical component, the combination of a ceramic dielectric substrate having a first surface and a second surface forming an edge of the substrate, at least one electrical device supported by the first surface, said substrate being provided with a plurality of notches, each of said notches having a first opening communicating with the first surface and a second opening communicating with the second surface, both of the openings of each of the notches extending to the edge, each of the notches having a constricted section and an enlarged section, the width of the constricted section being less than the width of the enlarged section, the constricted section being between the second opening and the enlarged section of each of the notches, a plurality of lead wires having end portions wedged in each of the notches for increasing the pull-out strength normal to the axes of the lead wires, the axes of the lead wires being spaced from the first surface, the end portion of each of the lead wires in the enlarged section being of greater width than the end portion of each of the lead wires in the constricted section for increasing the pull-out strength of the lead wires axially of the lead wires, and conductive means electrically connecting the lead wires to said at least one electrical device.

2. The electrical component of claim 1 wherein each of the notches is defined by a pair of side walls, a bottom wall, and a rear wall, a protuberance is integral with one of the side walls, the distance from the protuberance integral with the one side wall to the other side wall of each notch defining the constricted section of each notch.

3. The electrical component of claim 1 wherein each notch is defined by a bottom wall, a rear wall, and a pair of side walls, a protuberance is integral with each of the side walls, the width between the protuberances of each notch defining the constricted section of each notch.

4. The electrical component of claim 3 wherein the protuberances are elongated and normal to the axes of the lead wires and extend upwardly from the bottom wall of each of the notches to the first surface.

5. The electrical component of claim 1 wherein the width of the constricted section of each of the notches is tapered toward the bottom wall thereof.

6. In an electrical component, the combination of a ceramic dielectric substrate having a first surface and a second surface forming an edge of the substrate, at least one electrical device supported by the first surface, said substrate being provided with a plurality of notches, said notches having a first opening communicating with the first surface and a second opening communicating with the second surface, both of the openings of each of the notches extending to the edge, each of said notches having a pair of side walls, at least one of said side walls of each notch being provided with a grooved portion, a lead wire wedged in each of said notches for increasing the pull-out strength normal to the axes of the lead wires, a portion of each of the lead wires being disposed in the grooved portion for maintaining the lead wires firmly anchored in the substrate, and conductive means connecting the lead wires to said at least one electrical device.

7. In an electrical component, the combination of a ceramic dielectric substrate having a first surface and a second surface forming an edge of the substrate, an electrical device supported by the first surface, said substrate being provided with a plurality of notches, said notches having a first opening communicating with the first surface and a second opening communicating with the second surface, each of the notches having a constricted section and an enlarged section. the width of the constricted section being less than the width of the enlarged section, the constricted section being closer to the second surface than the enlarged section, a plurality of lead wires, each of the lead wires having an end portion wedged in one of the notches for increasing the pull-out strength normal to the axes of the lead wires, the axes of the lead wires being spaced from the first surface, the end portion of each of the lead wires in the enlarged section being of greater width than the portion of the lead wires in the constricted section for increasing the pull-out strength of the lead wires axially of the lead wires, and conductive means electrically connecting the lead wides to said electrical device.

8. The electrical component of claim 7 wherein each of the notches is defined by a pair of side walls, a bottom wall, and a rear wall, a protuberance is integral with one of the side walls of each of the notches, the distance from the protuberance of the one sidewall to the other side wall of each of the notches defining the constricted section of each notch.

9. The electrical component of claim 8 wherein each of the protuberances are elongated and normal to the axis of the lead wire anchored therein and extend upwardly from the bottom wall of each of the notches to the first surface.

References Cited

UNITED STATES PATENTS

| | | | |
|---|---|---|---|
| 2,971,138 | 2/1961 | Meisel et al. | 317—234 |
| 3,029,495 | 4/1962 | Doctor | 317—101 X |
| 3,280,378 | 10/1966 | Brady et al. | 317—101 |
| 3,265,806 | 8/1966 | Burks et al. | 174—52 |

JAMES D. KALLAM, Primary Examiner

U.S. Cl. X.R.

317—231, 235